United States Patent
Uchida (10) Patent No.: US 8,102,112 B2
(45) Date of Patent: Jan. 24, 2012

(54) ORGANIC ELECTROLUMINESCENT DEVICE HAVING UNIFORM ORGANIC LAYER, AND METHOD OF MANUFACTURING THE SAME

(75) Inventor: Masahiro Uchida, Chino (JP)

(73) Assignee: Seiko Epson Corporation, Tokyo (JP)

( * ) Notice: Subject to any disclaimer, the term of this patent is extended or adjusted under 35 U.S.C. 154(b) by 304 days.

(21) Appl. No.: 11/624,930

(22) Filed: Jan. 19, 2007

(65) Prior Publication Data

US 2008/0012472 A1    Jan. 17, 2008

(30) Foreign Application Priority Data

Feb. 1, 2006    (JP) ................... 2006-024167

(51) Int. Cl.
*H01L 51/52*    (2006.01)
*H01L 51/56*    (2006.01)
(52) U.S. Cl. .............. 313/504; 315/169.3; 445/24
(58) Field of Classification Search ................. 313/509, 313/504–508, 510–512; 315/169.3; 445/23, 445/24
See application file for complete search history.

(56) References Cited

U.S. PATENT DOCUMENTS

| 6,222,315 | B1 | 4/2001 | Yoshizawa et al. | |
|---|---|---|---|---|
| 6,798,132 | B2 * | 9/2004 | Satake | 313/495 |
| 7,253,433 | B2 | 8/2007 | Ishida et al. | |
| 2001/0025958 | A1 * | 10/2001 | Yamazaki et al. | 257/72 |
| 2003/0098645 | A1 * | 5/2003 | Lee et al. | 313/504 |
| 2005/0012454 | A1 * | 1/2005 | Yamazaki et al. | 313/506 |
| 2005/0023969 | A1 * | 2/2005 | Omata et al. | 313/504 |
| 2005/0057151 | A1 * | 3/2005 | Kuwabara | 313/506 |
| 2005/0093438 | A1 * | 5/2005 | Chen | 313/506 |
| 2005/0242713 | A1 * | 11/2005 | Yamazaki | 313/503 |
| 2007/0063639 | A1 * | 3/2007 | Hamano et al. | 313/504 |
| 2007/0249076 | A1 | 10/2007 | Ishida et al. | |
| 2009/0160331 | A1 | 6/2009 | Omata et al. | |

FOREIGN PATENT DOCUMENTS

| JP | A-11-097182 | 4/1999 |
|---|---|---|
| JP | A 2001-189192 | 7/2001 |
| JP | A-2002-006129 | 1/2002 |
| JP | A-2002-215065 | 7/2002 |
| JP | A-2004-103502 | 4/2004 |
| JP | A-2005-093280 | 4/2005 |
| JP | A 2005-222776 | 8/2005 |
| WO | WO 2004045253 A1 * | 5/2004 |

OTHER PUBLICATIONS

WO 2004045253 machine translation.*

* cited by examiner

*Primary Examiner* — Nimeshkumar Patel
*Assistant Examiner* — Steven Horikoshi
(74) *Attorney, Agent, or Firm* — Oliff & Berridge, PLC (57) ABSTRACT

An organic electroluminescent device includes: a substrate; an organic layer that is capable of emitting light; and partition walls that surround pixel regions provided on the substrate. In the organic electroluminescent device, the organic layer is formed so as to continue to the pixel regions surrounded by the partition walls and the upper surface of the partition walls. When the height of the partition walls is set to $H_B$ and the thickness of the organic layer in the pixel regions is set to $H_E$, the height $H_B$ of the partition walls is set to be equal to or smaller than two times the thickness $H_E$.

6 Claims, 9 Drawing Sheets

AREA RATIO OF LIGHT-EMITTING
REGION TO PIXEL REGION;
$\frac{28^2}{30^2} \times 100 = 87$ (%)

AREA RATIO OF LIGHT-EMITTING
REGION TO PIXEL REGION;
$\frac{9^2}{30^2} \times 100 = 9$ (%)

ORGANIC ELECTROLUMINESCENT DEVICE HAVING UNIFORM ORGANIC LAYER, AND METHOD OF MANUFACTURING THE SAME

BACKGROUND

1. Technical Field

The present invention relates to an organic electroluminescent device (hereinafter, referred to as an organic EL device), a method of manufacturing the same, and an electronic apparatus,

2. Related Art

The application of an organic EL device capable of performing surface emission as a light source for display, a light source for illumination, or a light source for an electrophotographic printer has been attempted. For example, JP-A-2001-189192 and JP-A-2005-222776 disclose a technique of supplying a liquid material including a material for forming an organic layer capable of emitting light to regions surrounded by partition walls (banks) in an organic EL device.

However, when a liquid material including a material for forming an organic layer is coated on a substrate, for example, by a spin coating method with the partition walls being formed so as to surround pixel regions provided on the substrate, the thickness of the organic layer to be formed within the pixel regions may be non-uniform due to, for example, the structure of the partition walls. If the thickness of the organic layer becomes non-uniform, it is likely that the luminance of light emitted from the organic layer becomes non-uniform, which makes it difficult to emit desired light.

SUMMARY

An advantage of some aspects of the invention is that it provides an organic EL device capable of emitting desired light, a method of manufacturing the organic EL device, and an electronic apparatus including the organic EL device.

According to an aspect of the invention, an organic electroluminescent device includes: a substrate; an organic layer capable of emitting light; and partition walls that surround pixel regions provided on the substrate. In the organic electroluminescent device, the organic layer is formed so as to continue to the pixel regions surrounded by the partition walls and the upper surface of the partition walls. When the height of the partition walls is set to $H_B$ and the thickness of the organic layer in the pixel regions is set to $H_E$, the height $H_B$ of the partition walls is set to be equal to or smaller than two times the thickness $H_E$.

The inventor has found that, when the organic layer is formed so as to continue to the pixel region surrounded by the partition wall and the upper surface of the partition wall, the uniformity of the thickness of the organic layer within the pixel region can be set to a desirable level by setting the height $H_B$ of the partition wall to be equal to or smaller than two times the thickness $H_E$ of the organic layer in the pixel region. In accordance with this aspect, when the partition wall and the organic layer are provided so as to satisfy $H_B \leq 2 \times H_E$, it is possible to obtain the organic layer with a uniform thickness. Therefore, light having uniform luminance can be emitted from the organic layer, so that desired light can be emitted.

In the organic electroluminescent device according to the above-mentioned aspect, preferably, when the diameter of each of the pixel regions is set to $L_1$, the height $H_B$ of the partition walls is set to be equal to or smaller than 0.01 times the diameter $L_1$.

The inventor has found that the uniformity of the thickness of the organic layer within the pixel region can be set to a more desirable level by setting the height $H_B$ of the partition wall to be equal to or smaller than 0.01 times the diameter $L_1$ of the pixel region. In accordance with this aspect, when the partition wall is provided in accordance with the dimension of the pixel region so as to satisfy $H_B \leq 0.01 \times L_1$, it is possible to obtain the organic layer with a uniform thickness. Therefore, light with uniform luminance can be emitted from the organic layer, so that desired light can be emitted.

According to another aspect of the invention, an organic electroluminescent device includes: a substrate; an organic layer capable of emitting light; partition walls that surround pixel regions provided on the substrate; and wiring lines that are provided between the substrate and the partition walls. In the organic electroluminescent device, when the height of the partition walls is set to $H_B$, the thickness of the organic layer in the pixel regions is set to $H_E$, and the height of the wiring lines is set to $H_L$, the sum of the height $H_B$ of the partition walls and the height $H_L$ of the wiring lines is equal to or smaller than two times the thickness $H_E$.

The inventor has found that, when the organic layer is formed so as to continue to the pixel region surrounded by the partition wall and the upper surface of the partition wall, and when the wiring lines are provided between the substrate and the partition walls, the uniformity of the thickness of the organic layer within the pixel region can be set to a desirable level by setting the sum of the height $H_B$ of the partition wall and the height $H_L$ of the wiring line to be equal to or smaller than two times the thickness $H_E$. In accordance with this aspect, when the partition wall, the organic layer, and the wiring lines are provided so as to satisfy $H_B + H_L \leq 2 \times H_E$, it is possible to obtain the organic layer with a uniform thickness. Therefore, light with uniform luminance can be emitted from the organic layer, so that desired light can be emitted.

In the organic electroluminescent device according to the above-mentioned aspect, preferably, when the diameter of each of the pixel regions is set to $L_1$ and the distance between the edge of each of the pixel regions and the edge of a corresponding one of the wiring lines is set to $L_2$, a value that is 0.7 times the diameter $L_1$ is set to be equal to or smaller than the distance $L_2$.

That is, it is likely that a step will be formed on the inner surface of the partition wall due to the wiring lines. Further, it is likely that the thickness of the organic layer within the pixel region will become non-uniform due to the step. However, the inventor has found that, when the distance $L_2$ between the edge of the pixel region and the edge of the wiring lines is set to be equal to or large than 0.7 times the diameter $L_1$ of the pixel region, it is possible to prevent the step from being formed, which makes it possible to improve the uniformity of the thickness of the organic layer within the pixel region to a desirable level. In accordance with this aspect, when the wiring lines are provided at positions separated from the pixel region by a predetermined distance in accordance with the dimension of the pixel region so as to satisfy $0.7 \times L_1 \leq L_2$, it is possible to obtain the organic layer having a uniform thickness. Therefore, light with uniform luminance can be emitted from the organic layer, so that desired light can be emitted.

In the organic electroluminescent device according to the above-mentioned aspect, preferably, the sum of the height $H_B$ of the partition walls and the height $H_L$ of the wiring lines is equal to or smaller than 0.01 times the diameter $L_1$.

The inventor has found that, when the sum of the height $H_B$ of the partition wall and the height $H_L$ of the wiring lines is equal to or smaller than 0.01 times the diameter $L_1$, the uniformity of the thickness of the organic layer within the pixel region can be set to a more desirable level. In accordance with this aspect, when the partition wall and the wiring line are provided in accordance with the dimension of the pixel region so as to satisfy $H_B+H_L \leq 0.01 L_1$, it is possible to obtain the organic layer having a uniform thickness. Therefore, light with uniform luminance can be emitted from the organic layer, so that desired light can be emitted.

According to still another aspect of the invention, an organic electroluminescent device includes: a substrate; an organic layer capable of emitting light; and partition walls that surround pixel regions provided on the substrate. In the organic electroluminescent device, the organic layer is formed so as to continue to the pixel regions surrounded by the partition walls and the upper surface of the partition walls. When the area of a light-emitting region capable of emitting light having a predetermined proportion of luminance $K_P$ with respect to the maximum luminance $K_M$ of light emitted from the organic layer within the pixel regions is set to $A_P$, the area of each of the pixel regions is set to $A_1$, and $A_P/A_1$ is the area ratio of the light-emitting region to an individual one of the pixel regions, the height $H_B$ of the partition walls, the thickness $H_E$ of the organic layer in the pixel regions, and the diameter $L_1$ of each of the pixel regions are set in accordance with a target value of the area ratio of the light-emitting region to the individual one of the pixel regions.

According to the above-mentioned structure, when the height $H_B$ of the partition wall, the thickness $H_E$ of the organic layer in the pixel region, and the diameter $L_1$ of the pixel region are set in accordance with a target value (for example, 0.7) of the area ratio of the light-emitting region to the pixel region that is defined by $A_P/A_1$, it is possible to form the organic layer having a thickness with desirable uniformity. Therefore, light with uniform luminance can be emitted from the organic layer, so that desired light can be emitted.

According to yet another aspect of the invention, an organic electroluminescent device includes: a substrate; an organic layer capable of emitting light; partition walls that surround pixel regions provided on the substrate; and wiring lines that are provided between the substrate and the partition walls. In the organic electroluminescent device, the organic layer is formed so as to continue to the pixel regions surrounded by the partition walls and the upper surface of the partition walls. When the area of a light-emitting region capable of emitting light having a predetermined proportion of luminance $K_P$ with respect to the maximum luminance $K_M$ of light emitted from the organic layer within the pixel region is set to $A_P$, the area of each of the pixel regions is set to $A_1$, and $A_P/A_1$ is the area ratio of the light-emitting region to an individual one of the pixel regions, the height $H_B$ of the partition walls, the thickness $H_E$ of the organic layer in the pixel regions, the height $H_L$ of the wiring lines, the diameter $L_1$ of each of the pixel regions, and the distance $L_2$ between the edge of each of the pixel regions and the edge of a corresponding one of the wiring lines are set in accordance with a target value of the area ratio of the light-emitting region to the individual one of the pixel regions.

According to the above-mentioned structure, when the height $H_B$ of the partition wall, the thickness $H_E$ of the organic layer in the pixel region, the height $H_L$ of the wiring line, the diameter $L_1$ of the pixel region, and the distance $L_2$ between the edge of the pixel region and the edge of the wiring lines are set in accordance with a target value (for example, 0.7) of the area ratio of the light-emitting region to the pixel region defined by $A_P/A_1$, it is possible to form the organic layer having a thickness with desirable uniformity. Therefore, light with uniform luminance can be emitted from the organic layer, so that desired light can be emitted.

According to yet still another aspect of the invention, an electronic apparatus includes the above-mentioned organic EL device.

In accordance with this aspect, there is provided an electronic apparatus including the organic EL device which is capable of emitting desired light.

According to still yet another aspect of the invention, there is provided a method of manufacturing an organic electroluminescent device having an organic layer capable of emitting light. The method includes: forming partition walls so as to surround pixel regions provided on a substrate; and supplying a liquid material including a material for forming the organic layer so as to continue to the pixel regions surrounded by the partition walls and the upper surface of the partition walls. In the method, when the height of the partition walls is set to $H_B$ and the thickness of the organic layer in the pixel regions is set to $H_E$, the height $H_B$ of the partition walls is set to be equal to or smaller than two times the thickness $H_E$.

The inventor has found that, when a liquid material including a material for forming the organic layer is supplied so as to continue to the pixel region surrounded by the partition wall and the upper surface of the partition wall, the uniformity of the thickness of the organic layer within the pixel region can be set to a desirable level by setting the height $H_B$ of the partition wall to be equal to or smaller than two times the thickness $H_E$ of the organic layer in the pixel region. In accordance with this aspect, when the partition wall and the organic layer are provided so as to satisfy $H_B \leq 2 \times H_E$, it is possible to obtain the organic layer having a uniform thickness. Therefore, light with uniform luminance can be emitted from the organic layer, so that desired light can be emitted.

According to still yet another aspect of the invention, there is provided a method of manufacturing an organic electroluminescent device having an organic layer capable of emitting light. The method includes: forming wiring lines at predetermined positions on a substrate; forming partition walls on the substrate so as to surround pixel regions provided on the substrate, with the wiring lines interposed between the substrate and the partition walls; and supplying a liquid material including a material for forming the organic layer so as to continue to the pixel regions surrounded by the partition walls and the upper surface of the partition walls. In the method, when the height of the partition walls is set to $H_B$, the thickness of the organic layer in the pixel regions is set to $H_E$, and the height of the wiring lines is set to $H_L$, the sum of the height $H_B$ of the partition walls and the height $H_L$ of the wiring lines is equal to or smaller than two times the thickness $H_E$.

The inventor has found that, when the organic layer is formed so as to continue to the pixel region surrounded by the partition wall and the upper surface of the partition wall, and when the wiring lines are provided between the substrate and the partition walls, the uniformity of the thickness of the organic layer within the pixel region can be set to a desirable level by setting the sum of the height $H_B$ of the partition wall and the height $H_L$ of the wiring lines to be equal to or smaller than two times the thickness $H_E$. In accordance with this aspect, when the partition wall, the organic layer, and the wiring line are provided so as to satisfy $H_B+H_L \leq 2 \times H_E$, it is possible to obtain the organic layer having a uniform thickness. Therefore, light with uniform luminance can be emitted from the organic layer, so that desired light can be emitted.

In the method of manufacturing an organic electroluminescent device according to the above-mentioned aspect, preferably, in the supplying of the liquid material, the liquid material is coated on the pixel region and the upper surface of the partition wall by a spin coating method.

In accordance with this aspect, even when a plurality of pixel regions are formed on the substrate, it is possible to smoothly supply a liquid material to the individual pixel regions.

BRIEF DESCRIPTION OF THE DRAWINGS

The invention will be described with reference to the accompanying drawings, wherein like numbers refer like elements.

DESCRIPTION OF EXEMPLARY EMBODIMENTS

Hereinafter, embodiments of the invention will be described with reference to the drawings. In the following description, an XYZ orthogonal coordinate system is set, and the positional relationship between respective members will be described by referring to the XYZ orthogonal coordinate system. Further, a predetermined direction in the horizontal plane is set to an X-axis direction, a direction orthogonal to the X-axis direction in the horizontal plane is set to a Y-axis direction, and a direction (that is, a vertical direction) orthogonal to the X-axis and Y-axis directions is set to a Z-axis direction. In addition, the rotational directions around the X-axis, the Y-axis, and the Z-axis are set to θX, θY, and θZ directions, respectively.

First Embodiment

Figure 1:
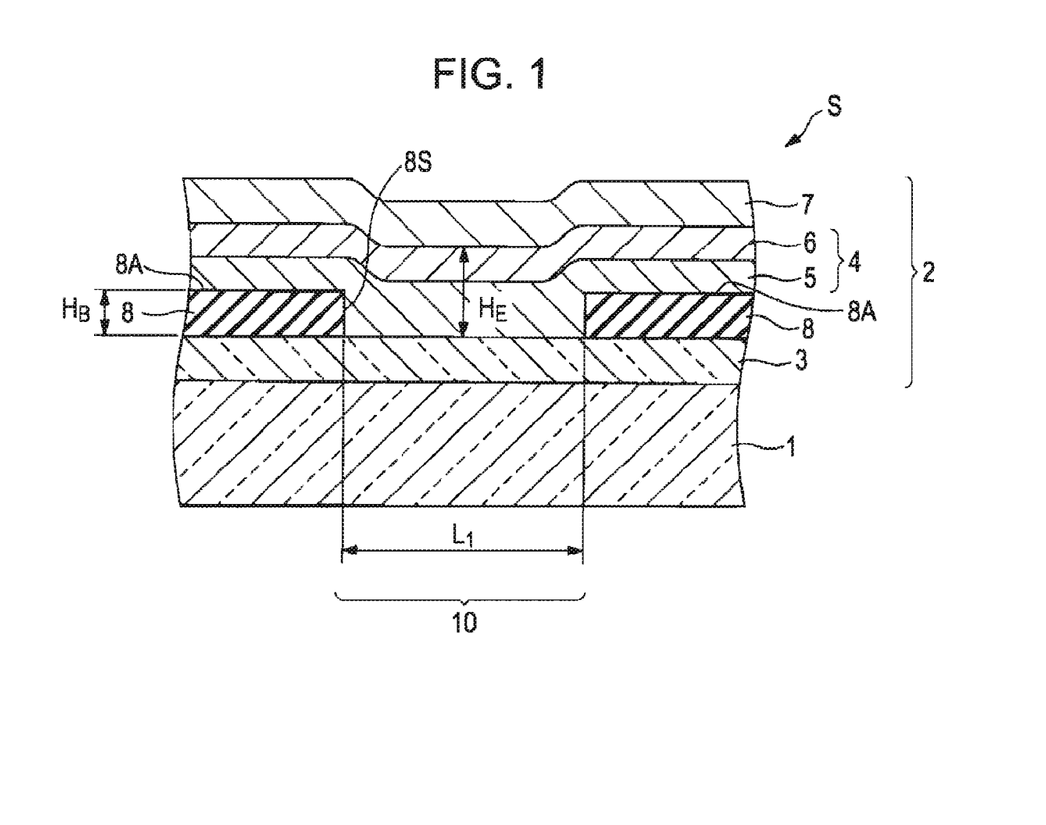
FIG. 1 is a side sectional view illustrating an organic EL device according to a first embodiment, of the invention.

A first embodiment of the invention will be described below. FIG. 1 is a side sectional view illustrating an organic EL device according to the first embodiment. In FIG. 1, an organic EL device S includes a substrate 1 and light-emitting elements (organic EL elements) 2 provided on the substrate 1. The light-emitting elements 2 are provided on the surface (active surface) of the substrate 1. Further, the organic EL device S includes a driving element (chip) (not shown) for driving the light-emitting elements 2. Wiring lines (not shown) are provided at predetermined positions on the surface of the substrate 1 so as to electrically connect the light-emitting elements 2 and the driving element.

Each of the light-emitting elements 2 includes an anode 3 formed on the surface of the substrate 1, an organic layer 4 capable of emitting light, and a cathode 7. In this embodiment, the organic layer 4 includes a hole transport layer 5 and a light emitting layer 6. The anode 3 and the cathode 7 are provided at both sides of the organic layer 4.

A plurality of pixel regions 10 are provided on the substrate 1, and a plurality of partition walls 8 are provided so as to surround the pixel regions 10. Further, the organic layer 4 is formed so as to continue to the pixel regions 10 surrounded by the partition walls 8 and an upper surface 8A of the partition walls 8.

The anode 3 of each of the light-emitting elements 2 is electrically connected to the driving element through a wiring line (not shown). Further, although not shown, the cathode 7 of each of the light-emitting elements 2 is also electrically connected to the driving element. The anode 3 and the cathode 7 of each of the light-emitting elements 2 are supplied with power (current) including a driving signal from the driving element.

The organic EL device S of this embodiment is a so-called bottom emission device that emits light from the light-emitting elements 2 from the surface of the substrate 1 to the outside of the device. Light emitted from the organic layer 4 within each of the pixel regions 10 passes through the substrate 1. The substrate 1 is formed of a transparent or translucent material capable of transmitting light, such as transparent glass, quartz, or sapphire, or transparent synthetic resin, such as polyester, polyacrylate, polycarbonate, or polyether ketone.

In each of the light-emitting elements 2, the anode 3 serves to inject holes into the hole transport layer 5 according to a voltage applied. The anode 3 is formed of a transparent conductive film such as ITO (indium tin oxide).

In each of the light-emitting elements 2, the hole transport layer 5 serves to transport/inject the holes of the anode 3 into the light-emitting element 6 and can be formed of a well-known material such as polythiophene, polyaniline, or polypyrrole. More specifically, the hole transport layer 5 may be formed of 3,4-polyethylenedioxythiophene/polystyrenesulfonate (PEDOT/PSS).

In each of the light-emitting elements 2, the light emitting layer 6 has a function of combining holes injected from the anode 3 via the hole transport layer 5 with electrons injected from the cathode 7 to generate fluorescence. The light emitting layer 6 may be formed of a known light emitting material capable of emitting fluorescence or phosphorescence. For example, the light emitting layer 6 can be formed of any of the following materials: a polyfluorene derivative (PF), a (poly)-p-phenylenevinylene derivative (PPV), a polyphenylene derivative (PP), a poly-p-phenylene derivative (PPP), polyvinylcarbazole (PVK), a polythiophene derivative, and a polymethylphenylsilane (PMPS).

Further, in each of the light-emitting elements 2, an electron transport layer may be provided between the light emitting layer 6 and the cathode 7. The electron transport layer has a function of injecting electrons into the light emitting layer 6. The electron transport layer can be formed of metal complexes, such as an oxadiazole derivative, anthraquinodimethane and a derivative thereof, benzoquinone and a derivative thereof, naphthaquinone and a derivative thereof, anthraquinone and a derivative thereof, tetracyanoanthraquinodimethane and a derivative thereof, a fluorenone derivative, diphenyldicyanoethylene and a derivative thereof, a diphenoquinone derivative, and 8-hydroxyquinoline and a derivative thereof.

The cathode 7 of each of the light-emitting elements 2 is formed of a metallic material having a low work function that is capable of effectively injecting electrons into the light emitting layer 6, such as aluminum (Al), magnesium (Mg), gold (Au), silver (Ag), or calcium (Ca).

The partition walls 8 for partitioning the pixel regions 10 are provided so as to surround the pixel regions 10. In this embodiment, each of the pixel regions 10 is provided in a circular shape. The partition walls 8 may be formed of an organic material having an insulation property, such as polyimide. Further, the partition walls 8 may be formed of an inorganic material having an insulation property, such as silicon dioxide. Alternatively, the partition walls 8 may be formed of a combination of an organic material and an inorganic material.

Further, if a driving signal is supplied to one of the light-emitting elements 2 by the driving element, a current flows between the anode 3 and the cathode 7. Then, one of the light-emitting elements 2 emits light such that the light is emitted from the outer surface of the transparent substrate 1. That is, the light emitted from the organic layer 4 (the light emitting layer 6) within the corresponding one of the pixel regions 10 surrounded by the partition walls 8 in the light-emitting element 2 passes through the substrate 1 and is then emitted from the outer surface of the substrate 1.

In this embodiment, the partition walls 8 and the organic layer 4 are provided so as to satisfy Expression 1 given below, when the height of each of the partition walls 8 is set to $H_B$ and the thickness of the organic layer 4 in the pixel region 10 is set to $H_E$:

$$H_B \leq 2 \times H_E. \quad \text{Expression 1}$$

Here, the thickness $H_E$ of the organic layer 4 indicates the thickness of a flat portion of the organic layer 4, and the flat portion has the smallest; thickness.

In this embodiment, each of the pixel regions 10 is formed in a circular shape, and when the diameter of each of the pixel regions 10 is set to $L_1$, the thickness $H_B$ of each of the partition walls 8 is determined in accordance with the diameter $L_1$ of each of the pixel regions 10 so as to satisfy Expression 2 given below:

$$H_B \leq 0.01 \times L_1. \quad \text{[Expression 2]}$$

Next, a method of manufacturing the organic EL device S having the above-mentioned structure will be described. As shown in a flowchart of FIG. 2, the method of manufacturing the organic LE device S in this embodiment includes a partition wall forming process S1 and a liquid material supplying process s2. In the partition wall forming process S1, the partition walls 8 are formed so as to surround the pixel regions 10 provided on the substrate 1. In the liquid material supplying process S2, a liquid material including a material for forming the organic layer 4 is supplied so as to continue to the pixel regions 10 surrounded by the partition walls 8 and the upper surface 8A of the partition walls 8. In the liquid material supplying process s2, the liquid material is coated on the pixel regions 10 and the upper surface 8a of the partition walls 8 by a spin coating method.

Figure 2:
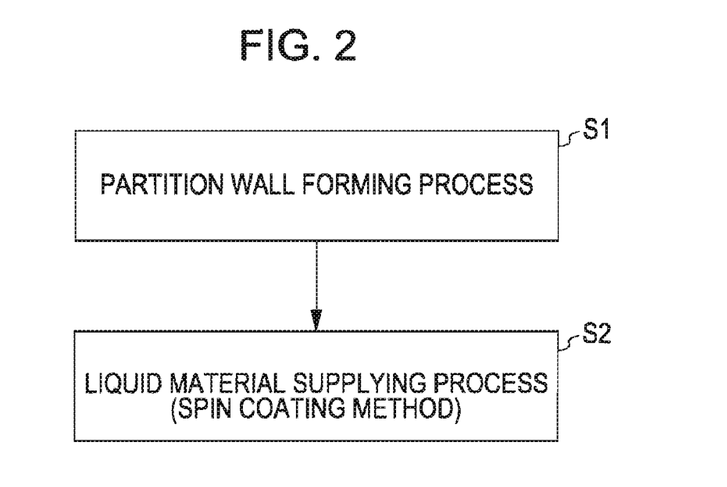
FIG. 2 is a flowchart illustrating a method of manufacturing the organic EL device according to the first embodiment.

After the anode 3 is formed on the substrate 1, a film for forming the partition walls 8 is formed. For example, a predetermined method, such as a spin coating method, a spray coating method, a roll coating method, a die coating method, or a dip coating method, is used to form the film for forming the partition walls 8. Further, a film is patterned by using a photolithography technique including, for example, an exposure process, a development process, and an etching process to form the partition walls 8 so as to surround the pixel regions 10 (the partition wall forming process S1).

Figure 3:
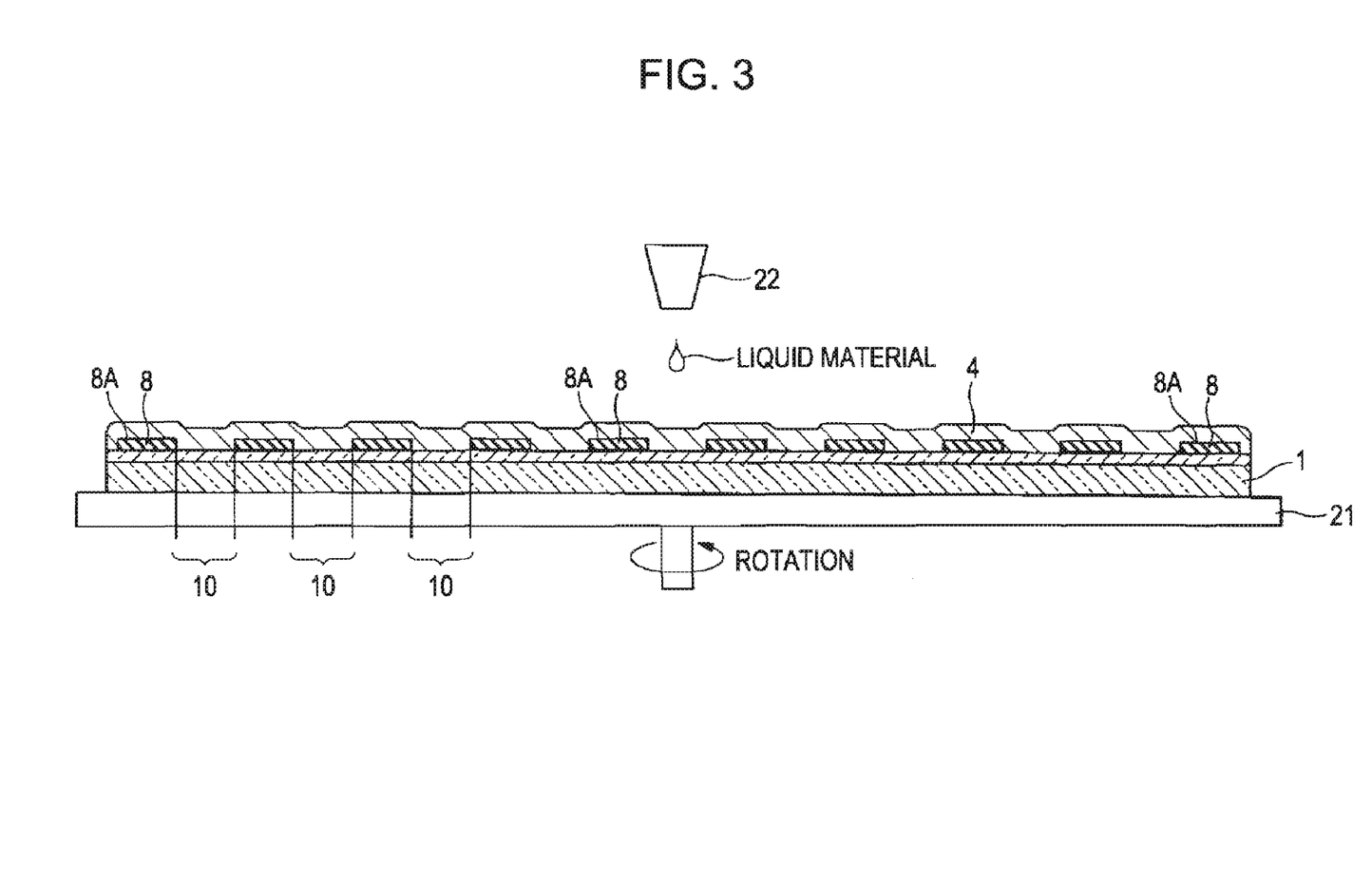
FIG. 3 is a schematic diagram illustrating a liquid material coated by a spin coating method.

As shown in a schematic view of FIG. 3, a liquid material including a material for forming the organic layer 4 (the hole transport layer 5 and the light emitting layer 6) is coated by a spin coating method so as to continue to the pixel regions 10 surrounded by the partition walls 8 and the upper surface 8a of the partition walls 8. That is, while the substrate 1 including the partition walls 8 is rotated by a rotating device 21, the liquid material including a material for forming the organic layer 4 is supplied onto the substrate 1 by a liquid material supply device 22. Then, the liquid material including the material for forming the organic layer 4 is coated so as to continue to the pixel regions 10 surrounded by the partition walls 8 and the upper surface 8a of the partition walls 8.

After the liquid material is coated, a predetermined process (for example, drying or heating) is executed. In this embodiment, manufacturing conditions including the respective processes S1 and S2 are set so as to satisfy Expression 1, when the height of each of the partition walls 8 is set to $H_B$ and the thickness of the organic layer 4 in the pixel region 10 is set to $H_E$. Then, the cathode 7 of each of the light-emitting elements 2 is formed on the organic layer 4, and thus the organic EL device 1 shown in FIG. 1 is manufactured.

In this embodiment, when the area of a light-emitting region capable of emitting light having a predetermined proportion of luminance $K_P$ with respect to the maximum luminance $K_M$ of light emitted from the organic layer 4 within the pixel region 10 is set to $A_P$, the area of the pixel region is set to $A_1$, and $A_P/A_1$ is set as the area ratio of the light-emitting region to the pixel region, the height $H_B$ of each of the partition walls 8, the thickness $H_E$ of the organic layer 4 in each of the pixel regions 10, and the diameter $L_1$ of each of the pixel regions 10 are set in accordance with a target value of the area ratio of the light-emitting region to the pixel region. That is, in this embodiment, the light-emitting region is defined as a region capable of emitting light having a predetermined proportion (for example, more than 95%) of luminance $K_P$ with respect to the maximum luminance $K_M$ in each of the pixel regions 10, and the area ratio of the light-emitting region to the pixel region is defined as $A_P/A_1$. When the area ratio of the light-emitting region to the pixel region is large, a luminance profile within each of the pixel regions 10 is uniform. When the area ratio of the light-emitting region to the pixel region is small, a luminance profile within the pixel region 10 is not uniform.

Figure 4A:
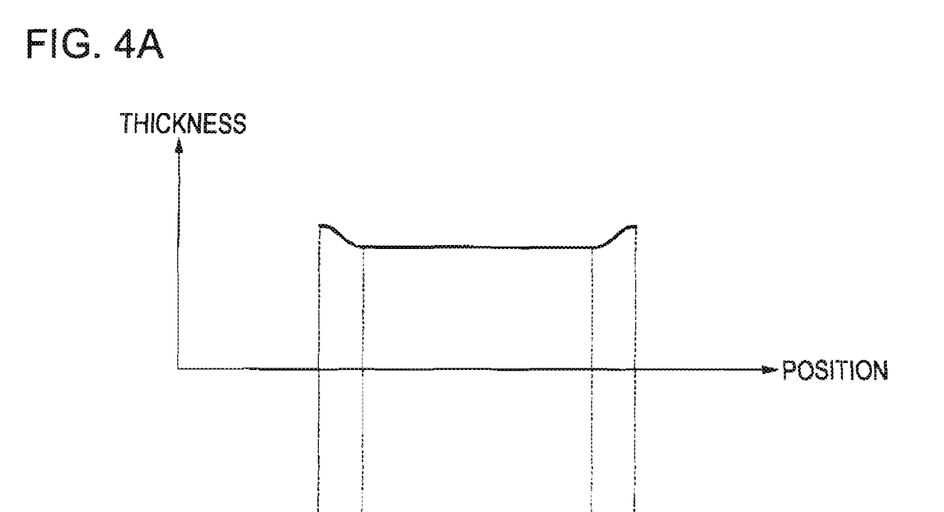
FIGS. 4A and 4B are schematic diagrams illustrating the relationship between a thickness profile and a luminance profile.
Figure 4B:
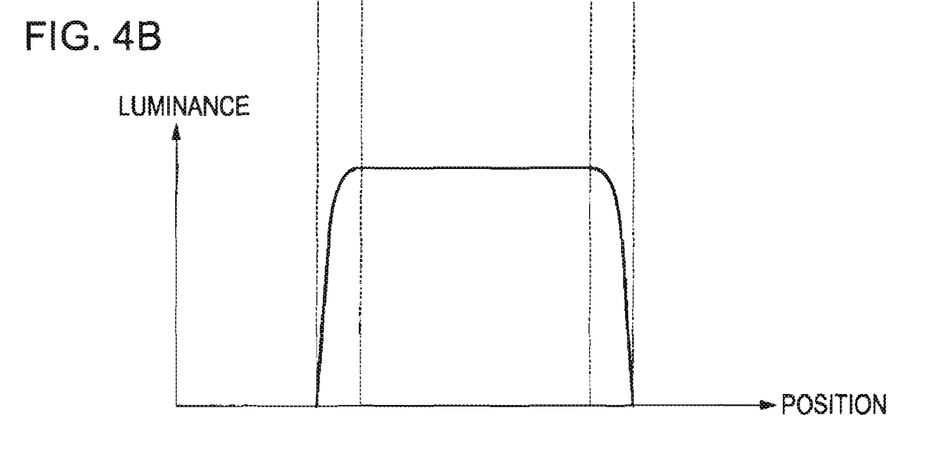

The luminance of light emitted from the organic layer 4 within each of the pixel regions 10 changes in accordance with the thickness of the organic layer 4 (the light emitting layer 6), and the luminance distribution (hereinafter, referred to as the luminance profile) of light emitted from the organic layer 4 within each of the pixel regions 10 changes in accordance with the thickness distribution (hereinafter, referred to as the thickness profile) of the organic layer 4 (the light emitting layer 6). As the thickness of the organic layer 4 (the light emitting layer 6) increases, the luminance of light emitted from the organic layer 4 within each of the pixel regions 10 decreases. For example, when the thickness profile of the organic layer 4 within each of the pixel regions 10 is that shown in FIG. 4A, the luminance profile is that shown in FIG. 4B. Therefore, when the thickness of the organic layer 4 in the vicinity of the inner surface 8S of the partition walls 8 is larger than the thickness of the organic layer 4 in the center of each of the pixel regions 10 as shown in FIG. 1, the luminance of light emitted from the region of the organic layer 4 in the vicinity of the inner surface 8S of the partition walls 8 becomes smaller than that of light emitted from the central region of each of the pixel regions 10.

Figure 5A:
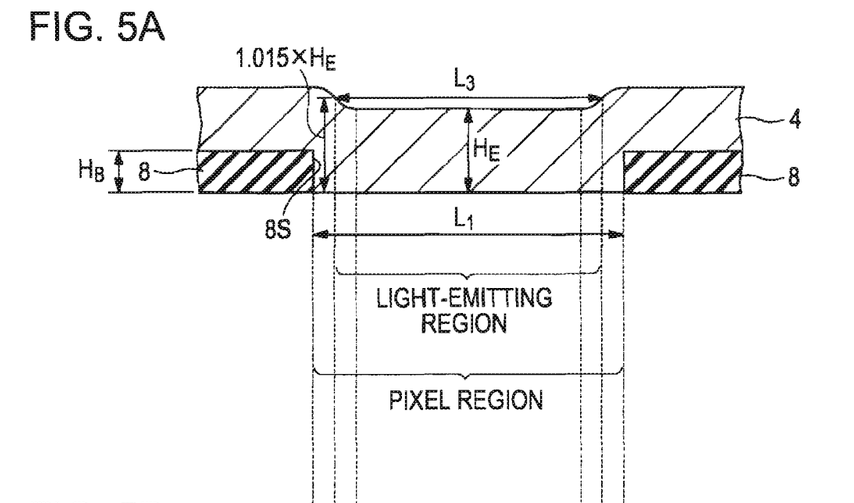
FIGS. 5A and 5B are schematic diagrams illustrating the relationship among a light-emitting region, a pixel region, the maximum luminance.
Figure 5B:
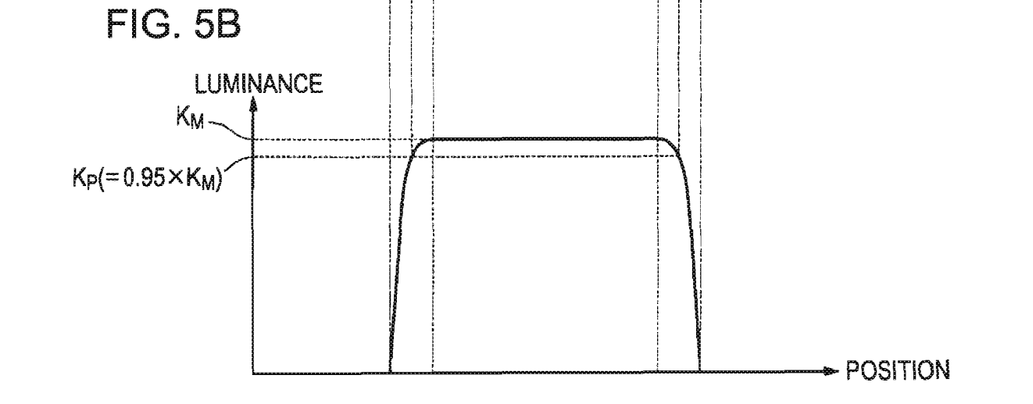

A case where the organic layer 4 having the thickness profile as shown in a schematic view of FIGS. 5A and 5B is formed will be considered. As shown in FIG. 5B, the luminance of light emitted from a thin region of the organic layer 4 within each of the pixel regions 10 becomes the maximum luminance $K_M$. In order to obtain uniform luminance, it is preferable that the light-emitting region capable of emitting light having a predetermined proportion (for example, more than 95%) of luminance $K_P$ with respect to the maximum luminance $K_M$ be as large as possible. That is, it is preferable that the area ratio of the light-emitting region to the pixel region be as large as possible. Further, it is preferable to obtain a thickness profile in which a flat and thin region is formed in a large size. In this embodiment, the height $H_B$ of each of the partition walls 8, the thickness $H_E$ of the organic layer 4 in each of the pixel regions 10, and the diameter $L_1$ of each of the pixel regions 10 are set in accordance with a target value (for example, 0.7) of the area ratio of the light-emitting region to the pixel region. That is, in this embodiment, the height Ha of each of the partition walls 8, the thickness $H_E$ of the organic layer 4 in each of the pixel regions 10, and the diameter $L_1$ of each of the pixel regions 10 are optimally set such that a desirable area ratio of the light-emitting region to the pixel region (more than 0.7), that is, the thickness profile is obtained in which a flat and thin region is formed in a large size. In this embodiment, in order to obtain a desired area ratio of the light-emitting region to the pixel region (more than 0.7), the dimension (diameter $L_3$) of a region having a predetermined proportion (for example, less than 101.5%) of thickness with respect to the minimum thickness $H_E$ is set to be more than 70% the dimension (diameter $L_1$) of the pixel region 10. That is, the diameter $L_3$ of the light-emitting region is set to be more than 70% the diameter $L_1$ of the pixel region 10.

In this embodiment, the height $H_B$ of each of the partition walls 8 and the thickness $H_E$ of the organic layer 4 in each of the pixel regions 10 are set in accordance with the dimension (the diameter $L_1$) of each of the pixel regions 10 such that Expressions 1 and 2 are satisfied. Therefore, it is possible to obtain a thickness profile capable of obtaining a desired area ratio of the light-emitting region to the pixel region (the size of the light-emitting region). Further, the thickness $H_E$ of the organic layer 4 is larger than the height $H_B$ of each of the partition walls 8 such that Expression 1 is satisfied, that is, such that each of the partition walls 8 does not have a large effect on the thickness profile, which makes it possible to obtain a desired area ratio of the light-emitting region to the pixel region. Further, the height $H_B$ of each of the partition walls 8 is sufficiently reduced in accordance with the dimension (the diameter $L_1$) of each of the pixel regions 10 such that Expression 2 is satisfied, which makes it possible to obtain a desired area ratio of the light-emitting region to the pixel region.

In addition, the target value (0.7) of the area ratio of the light-emitting region to the pixel region and the proportion (more than 95%) of the luminance $K_P$ with respect to the maximum luminance $K_M$ are just illustrative examples. Those values may depend on, for example, the specifications of the organic EL device S.

EXPERIMENTAL EXAMPLE

Figure 6A:
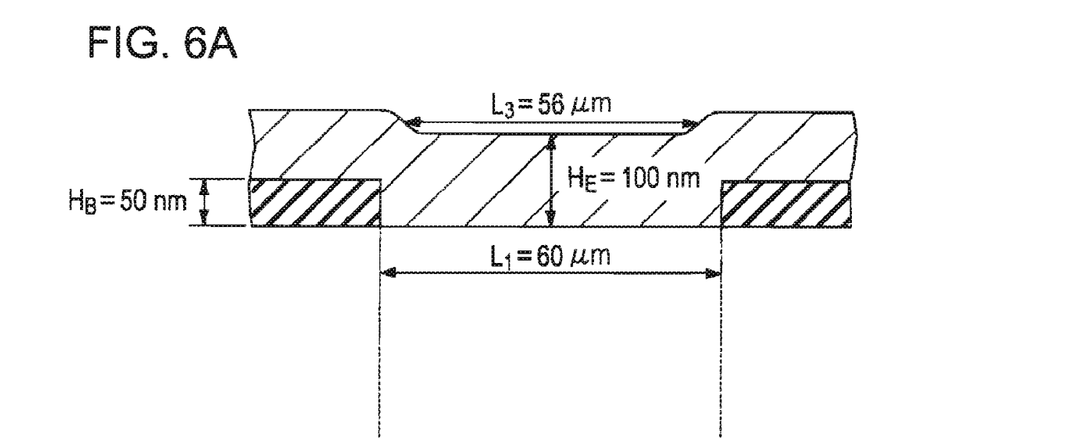
FIGS. 6A and 6B are diagrams illustrating an experimental example.
Figure 6B:
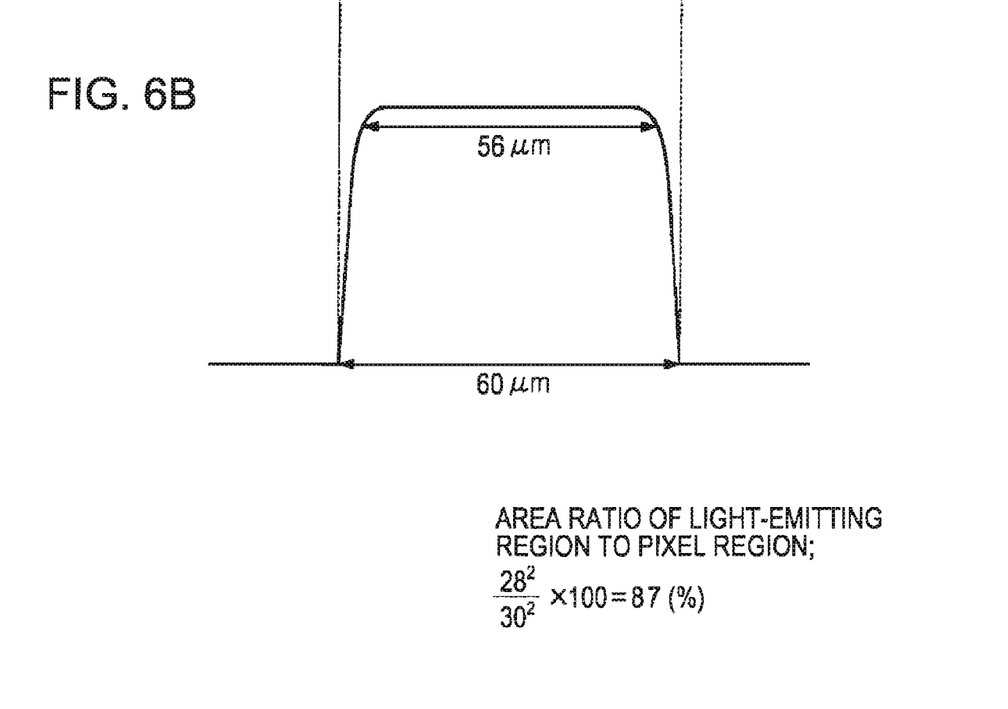

As shown in FIGS. 6A and 6B, the organic layer 4 is formed, in which the diameter $L_1$ of each of the pixel regions 10 is set to 60 µm, the height $H_B$ of each of the partition walls

8 is set to 50 nm, and the thickness $H_E$ is set to 100 nm. The organic layer 4 satisfies Expressions 1 and 2, In this case, the diameter $L_3$ of each of the light-emitting regions becomes 56 µm. Each of the pixel regions 10 and the light-emitting regions are formed in substantially circular shapes. Further, the area ratio of the light-emitting region to the pixel region becomes about 87%. As Expressions 1 and 2 are satisfied, it is possible to obtain the target value (70%) of the area ratio of the light-emitting region to the pixel region.

COMPARATIVE EXAMPLE

Figure 7A:
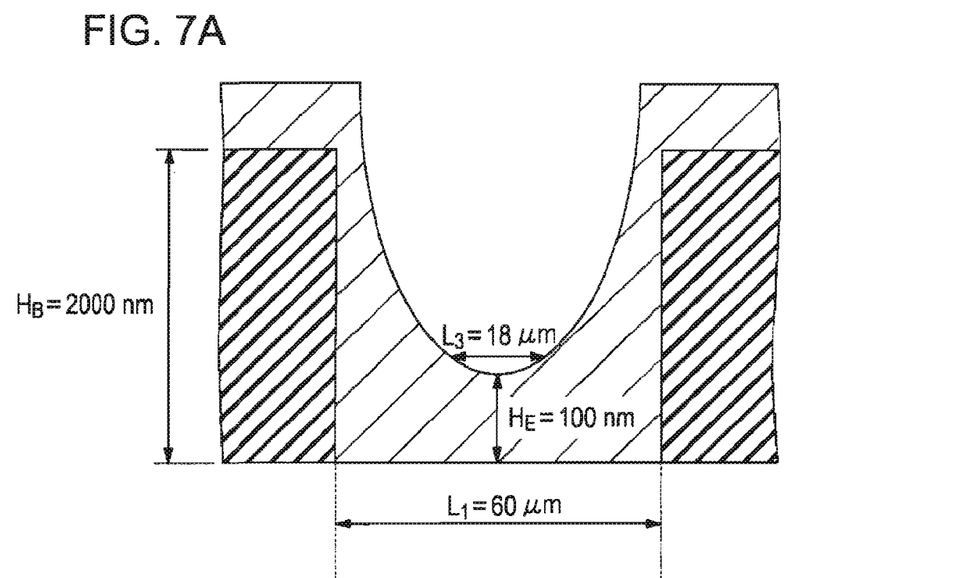
FIGS. 7A and 7B are diagrams illustrating a comparative example.
Figure 7B:
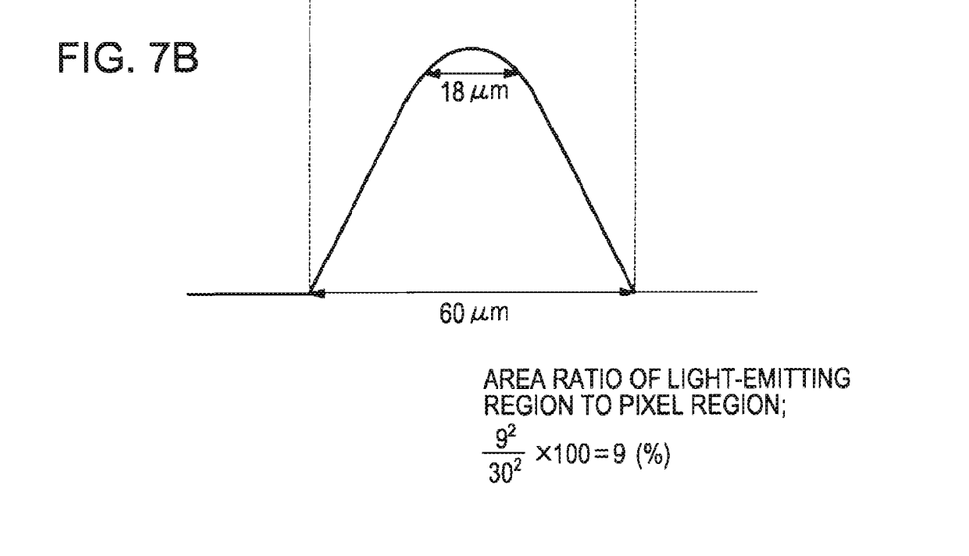

As shown in FIGS. 7A and 7B, an organic layer 4 is formed, in which the diameter $L_1$ of each of the pixel regions 10 is set to 60 µm, the height $H_B$ of each of the partition walls 8 is set to 2000 nm, and the thickness $H_E$ is set to 100 nm. The organic layer 4 does not satisfy Expressions 1 and 2. In this case, the diameter $L_3$ of the light-emitting region becomes 18 µnm, and the area ratio of the light-emitting region to the pixel region becomes about 9%. As such, when Expressions 1 and 2 are not satisfied, it can be found that the target value (70%) of the area ratio of the light-emitting region to the pixel region cannot be obtained.

As described above, when each of the partition walls 8 and the organic layer 4 are provided so as to satisfy Expression 1, $H_B \leq 2 \times H_E$, it is possible to make the thickness of the organic layer 4 uniform. Further, when each of the partition walls 8 is provided in accordance with the size of each of the pixel regions 10 such that Expression 2, $H_B \leq 0.01 \times L_1$, is satisfied, it is possible to make the thickness of the organic layer 4 more uniform. Therefore, light with uniform luminance can be emitted from the organic layer 4, so that desired light can be emitted.

Second Embodiment

A second embodiment of the invention will be described below. In the following description, like reference numerals will be attached to the same components as those in the first embodiment, and a detailed description thereof will be omitted.

Figure 8:
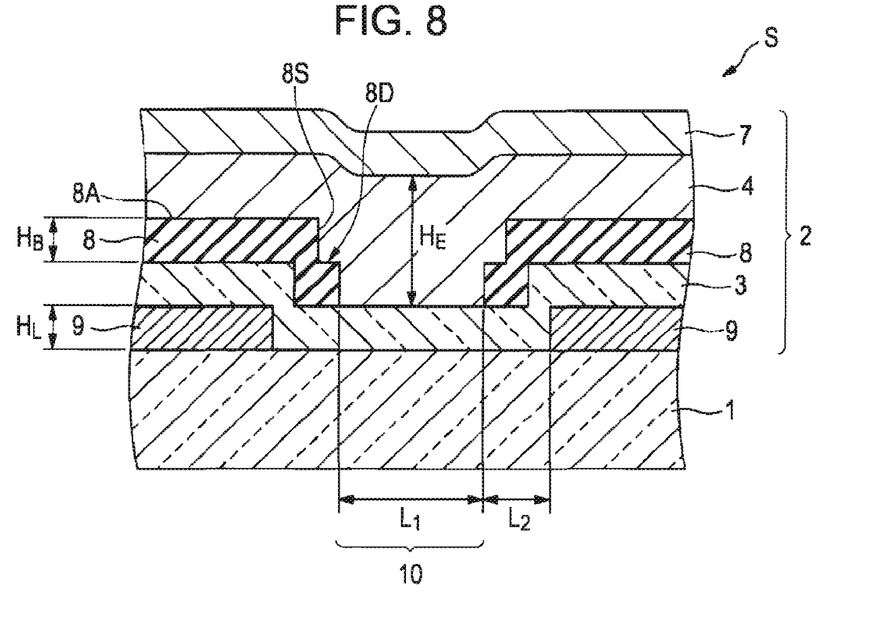
FIG. 8 is a side sectional view illustrating an organic EL device according to a second embodiment of the invention.

FIG. 8 is a side sectional view illustrating an organic EL device S according to the second embodiment. As shown in FIG. 8, the organic EL device S of this embodiment includes wiring lines 9 provided between a substrate 1 and each partition wall 8. Specifically, the wiring lines 9 are disposed between the substrate 1 and an anode 3 of each light-emitting element provided under the partition wall 8. As described above, the wiring lines 9 serve to electrically connect the light-emitting elements 2 and a driving element. The anode 3 of each of the light-emitting elements 2 is electrically connected to the driving element (not shown) through the wiring line 9.

Similar to the first embodiment, pixel regions 10 are provided on the substrate 1, and the partition walls 8 are provided so as to surround the pixel regions 10. Further, an organic layer 4 is formed so as to continue to each of the pixel regions 10 surrounded by each of the partition walls 8 and an upper surface 8A of the partition walls 8.

When a driving signal from the driving element is supplied to the light-emitting element 2, a current flows between the anode 3 and the cathode 7 of each of the light-emitting elements, which causes the light-emitting elements 2 to emit light. Then, the light is emitted from the outer surface of the transparent substrate 1. That is, the light emitted from the organic layer 4 (the light emitting layer 6) within each of the pixel regions 10 surrounded by each of the partition walls 8 in the corresponding one of the light-emitting elements 2 passes through the substrate 1 and is then emitted from the outer surface of the substrate 1.

Next, a method of manufacturing the organic EL device S having the above-mentioned structure will be described below. The method of manufacturing the organic EL device S in this embodiment includes a wiring line forming process S0, a partition wall forming process S1, and a liquid material supplying process S2. In the wiring line forming process S0, the wiring lines 9 are formed at predetermined positions of the substrate 1. In the partition wall forming process S1, the partition wall 8 is formed on the substrate 1 so as to surround the pixel region 10 provided on the substrate 1, with the wiring lines 9 interposed therebetween. In the liquid material supplying process S2, a liquid material including a material for forming the organic layer 4 is supplied so as to continue to each of the pixel regions 10 surrounded by each of the partition walls 8 and the upper surface 8A of the partition walls 8. In the liquid material supplying process, the liquid material including the material for forming the organic layer 4 is coated by a spin coating method so as to continue to each of the pixel regions 10 surrounded by each of the partition walls 8 and the upper surface 8A of the partition walls 8, similar to the first embodiment.

In this embodiment, the partition walls 8, the organic layer 4, and the wiring lines 9 are provided so as to satisfy Expression 3 given below, when the height of each of the partition walls 8 is set to $H_B$, the thickness of the organic layer 4 in each of the pixel regions 10 is set to $H_E$, and the height of each of the wiring lines 9 is set to $H_L$:

$$H_B + H_L \leq 2 \times H_E. \quad \text{[Expression 3]}$$

In this embodiment, each of the pixel regions 10 is formed in a circular shape, and when the diameter of each of the pixel regions 10 is set to $L_1$ and the distance (the shortest distance) between the edge of each of the pixel regions 10 and the edge of a corresponding one of the wiring lines 9 is set to $L_2$, the distance $L_2$ is determined in accordance with the diameter $L_1$ of each of the pixel regions 10 so as to satisfy Expression 4 given below:

$$0.7 \times L_1 \leq L_2. \quad \text{[Expression 4]}$$

In this embodiment, the height $H_B$ of each of the partition walls 8 and the height $H_L$ of each of the wiring lines 9 are determined in accordance with the diameter $L_1$ of each of the pixel regions 10 so as to satisfy Expression 5 given below:

$$H_B + H_L \leq 0.01 \times L_1. \quad \text{[Expression 5]}$$

In this embodiment, when the area of a light-emitting region capable of emitting light having a predetermined proportion of luminance $K_P$ with respect to the maximum, luminance $K_M$ of light emitted from the organic layer 4 within each of the pixel regions 10 is set to $A_P$, the area of each of the pixel regions is set to $A_1$, and $A_P/A_1$ is set as the area ratio of the light-emitting region to the pixel region, the height $H_B$ of each of the partition walls 8, the thickness $H_E$ of the organic layer 4 in each of the pixel-regions 10, the height $H_L$ of each of the wiring lines 9, the diameter $L_1$ of each of the pixel regions 10, and the distance $L_2$ between the edge of each of the pixel regions 10 and the edge of a corresponding one of the wiring lines 9 are set in accordance with a target value of the area ratio of the light-emitting region to the pixel region.

In this embodiment, the height $H_B$ of each of the partition walls 8, the thickness $H_E$ of the organic layer 4 in each of the pixel regions 10, the height $H_L$ of each of the wiring lines 9, the diameter $L_1$ of each of the pixel regions 10, and the distance $L_2$ between the edge of each of the pixel regions 10 and the edge of a corresponding one of the wiring lines 9 are optimally set in order to obtain a desired area ratio of the light-emitting region to the pixel region (more than 0.7), that is, in order to obtain a thickness profile where a flat and thin region is formed in a large size.

In this embodiment, the height $H_B$ of each of the partition walls 8, the thickness $H_E$ of the organic layer 4 in each of the pixel regions 10, the height $H_L$ of each of the wiring lines 9, and the distance $L_2$ between the edge of each of the pixel regions 10 and the edge of a corresponding one of the wiring lines 9 are set in accordance with the dimension (diameter $L_1$) of each of the pixel regions 10 so as to satisfy Expressions 3 to 5, which makes it possible to obtain a thickness profile where a desired area ratio of the light-emitting region to the pixel region (the size of the light-emitting region) is obtained. In addition, the thickness $H_E$ increases to the extent that the partition walls 8 or the wiring lines 9 does not have a large effect on a thickness profile, that is, Expression 3 is satisfied, which makes it possible to obtain a desired area ratio of the light-emitting region to the pixel region. Further, the height $H_B$ of each of the partition walls 8 and the height $H_L$ of each of the wiring lines are sufficiently reduced in accordance with the dimension (the diameter $L_1$) of each of the pixel regions 10 so as to satisfy Expression 5, which makes it possible to obtain a desired area ratio of the light-emitting region to the pixel region.

It is likely that a step 8D will be formed in the inner surface 8S of the partition walls 8 due to the wiring lines 9, and it is likely that the thickness of the organic layer 4 within each of the pixel regions 10 will become non-uniform due to the step 8D. However, when each of the wiring lines 9 is provided at a position separated from each of the pixel regions 10 by a predetermined distance in accordance with the dimension (diameter $L_1$) of each of the pixel regions 10 so as to satisfy Expression 4, it is possible to obtain the organic layer 4 having a uniform thickness.

As described above, when the wiring lines 9 are provided between the substrate 1 and the partition walls 8, the partition walls 8, the wiring lines 9, and the organic layer 4 are provided so as to satisfy Expression 3, $H_B + H_L \leq 2 \times H_E$, which makes it possible to obtain the organic layer 4 with a uniform thickness. Further, when each of the partition walls 8 and the wiring lines 9 are provided in accordance with the dimension of each of the pixel regions 10 so as to satisfy Expression 5, $H_B + H_1 \leq 0.01 \times L_1$, it is possible to make the thickness of the organic layer 4 more uniform. In addition, when the distance $L_2$ is set in accordance with the dimension of each of the pixel regions 10 so as to satisfy Expression 4, $0.7 \times L_1 \leq L_2$, it is possible to make the thickness of the organic layer 4 more uniform. Therefore, light having uniform luminance can be emitted from the organic layer 4, so that desired light can be emitted.

Third Embodiment

Figure 9:
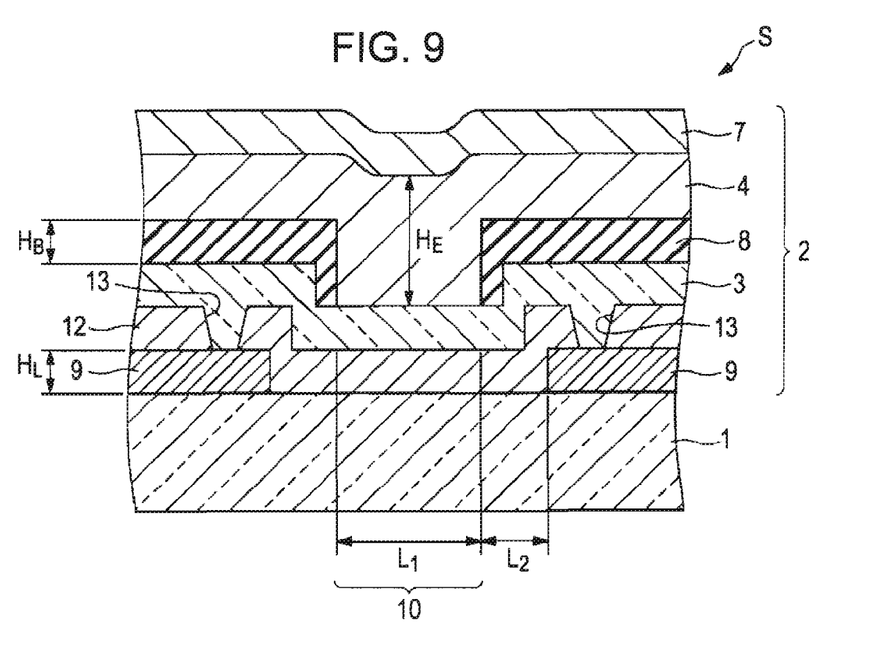
FIG. 9 is a side sectional view illustrating an organic EL device according to a third embodiment of the invention.

A third embodiment of the invention will be described below. FIG. 9 is a side sectional view illustrating an organic EL device S according to the third embodiment. As shown in FIG. 9, the organic EL device S of this embodiment includes an interlayer insulating layer 12 disposed between an anode 3 of each light-emitting element and the surface (active surface) of a substrate 1 including wiring lines 9. The anode 3 and the wiring line 9 are electrically connected to each other through a contact hole 13 formed at a predetermined position of the interlayer insulating layer 12.

Similar to the above-described embodiments, pixel regions 10 are provided on the substrate 1, and partition walls 8 are provided so as to surround the pixel regions 10. Further, an organic layer 4 is formed so as to continue to the pixel regions 10 surrounded by the partition walls 8 and an upper surface 8A of the partition walls 8.

In this embodiment, a liquid material including a material for forming the organic layer 4 is also coated by a spin coating method so as to continue to the pixel regions 10 surrounded by the partition walls 8 and the upper surface 8A of the partition walls 8.

In this embodiment, the partition walls 8, the wiring lines 9, and the organic layer 4 are also provided so as to satisfy $H_B + H_L \leq 2 \times H_E$, which makes it possible to obtain the organic layer 4 having a uniform thickness. Further, the partition walls 8 and the wiring lines 9 are also provided in accordance with the dimensions of the pixel regions 10 so as to satisfy $H_B + H_L \leq 0.01 \times L_1$, which makes it possible to obtain the organic layer 4 with a uniform thickness. In addition, when the distance $L_2$ is determined in accordance with the dimension of each of the pixel regions 10 so as to satisfy $0.7 \times L_1 \leq L_2$, which makes it possible to obtain the organic layer 4 having a uniform thickness. Therefore, light with uniform luminance can be emitted from the organic layer 4, so that desired light can be emitted.

In the first to third embodiments, the pixel regions 10 and the light-emitting regions are formed in circular shapes. However, the shapes of the pixel regions 10 and the light-emitting regions are optional. For example, the pixel regions 10 and the light-emitting regions may be formed in rectangular shapes. In this case, the height $H_B$ of each of the partition walls 8, the height $H_L$ of each of the wiring lines 9, and the distance $L_2$ between the edge of each of the pixel regions 10 and the edge of a corresponding one of the wiring lines 9 are set according to the width $L_1'$ of each of the pixel regions 10.

In the first to third embodiments, the organic layer 4 is composed of the hole transport layer 5 and the light emitting layer 6, but the invention is not limited thereto. For example, the organic layer 4 may include a hole injecting layer and an electron transport layer as material layers (functional layers).

In the first to third embodiments, the liquid material including the material for forming the organic layer 4 is coated on substantially the entire surface of the substrate 1 by using a spin coating method, but the invention is not limited thereto. For example, any method may be used to coat the liquid material on the substrate 1 as long as it can coat the liquid material on substantially the entire surface of the substrate 1 (wet coating method).

Optical Writing Head

Figure 10:
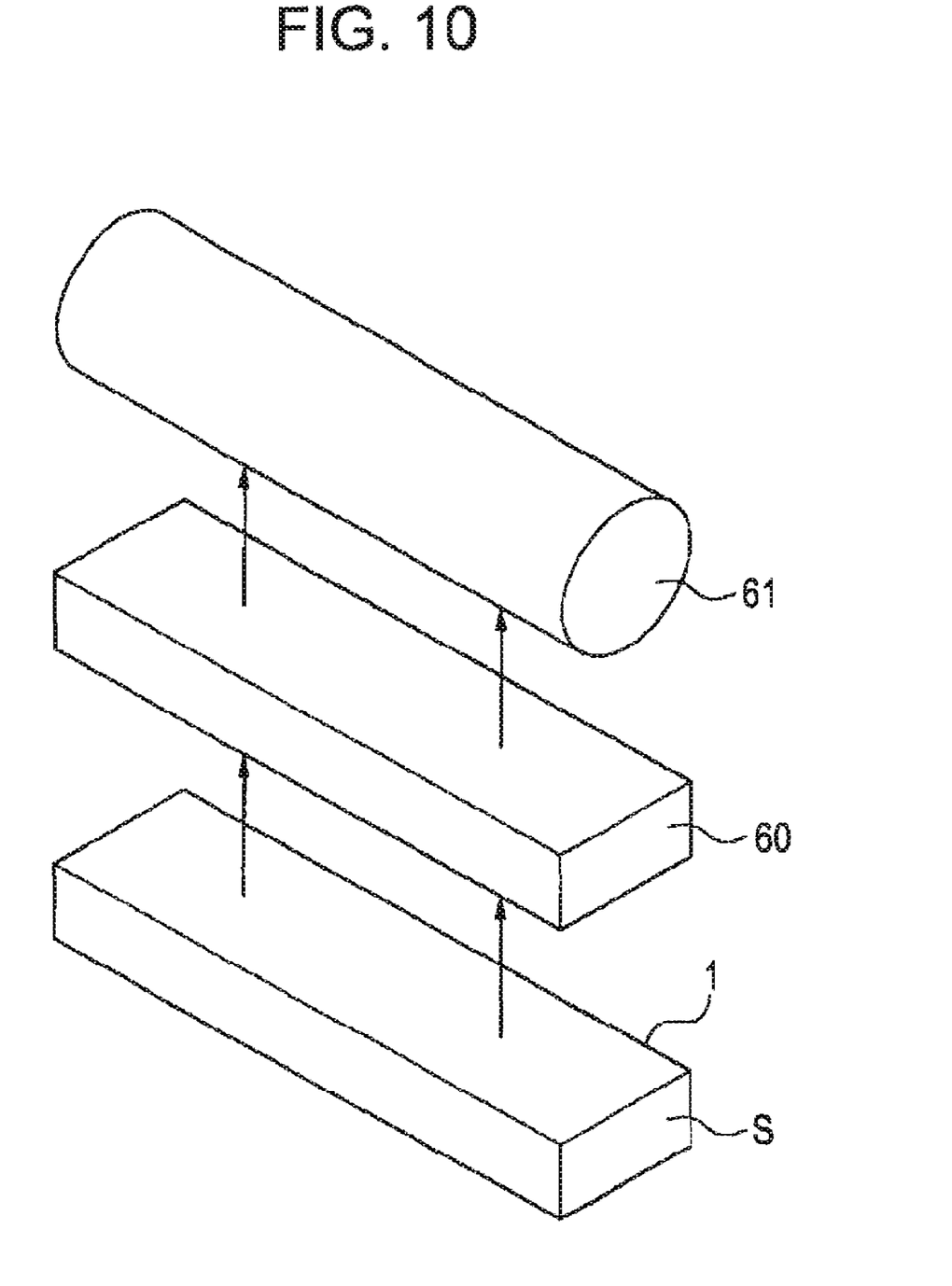
FIG. 10 is a diagram illustrating an example where the organic EL device is applied to an optical writing head.

FIG. 10 is a diagram showing an example where the above-described organic EL device S is applied to an optical writing head (printer head) of an electrophotographic printer. In FIG. 10, an optical system 60 is provided on the substrate 1 of the organic EL device S, and a photoconductor drum (photoconductor) 61 is provided on the optical system 60. The organic EL device S radiates light onto the photoconductor drum 61 through the optical system 60. The light emitted from the substrate 1 of the organic EL device S passes through the optical system 60 to be condensed on the photoconductor drum 61. Since the organic EL device S can emit light with uniform luminance (illuminance), the photoconductor drum 61 can be well exposed. Therefore, it is possible to form a high-quality image by using the photoconductor drum 61.

Electronic Apparatus

Next, an example of an electronic apparatus including the above-described organic EL device S will be described. The organic EL device S can be used as a light source for illumination which can perform surface emission. For example, the organic EL device S can be used as a backlight forming a display unit of a liquid crystal display device.

Figure 11A:
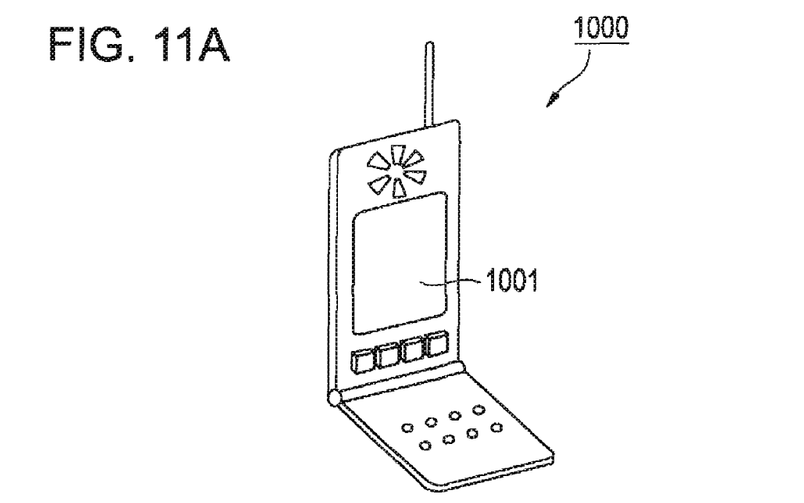
FIG. 11 is a diagram illustrating an example of an electronic apparatus including the organic EL device.

FIG. 11A is a perspective view showing an example of a mobile phone. In FIG. 11A, reference numeral 1000 represents a mobile phone main body, and reference numeral 1001 represents a display unit using the organic EL device S.

Figure 11B:
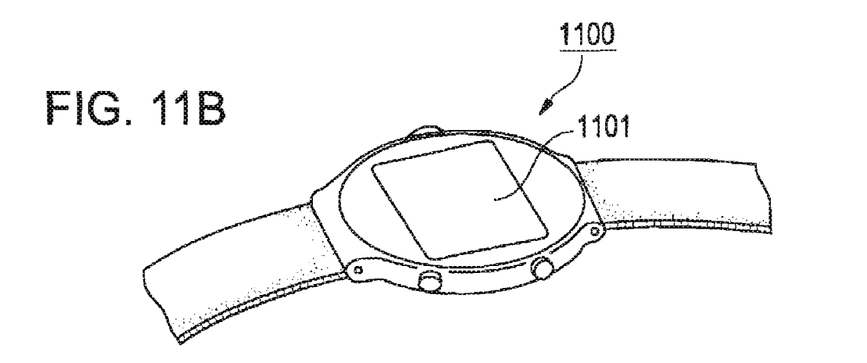

FIG. 11B is a perspective view showing an example of a wrist-watch-type electronic apparatus. In FIG. 11B, reference numeral 1100 represents a watch main body, and reference numeral 1101 represents a display unit using the organic EL device S.

Figure 11C:
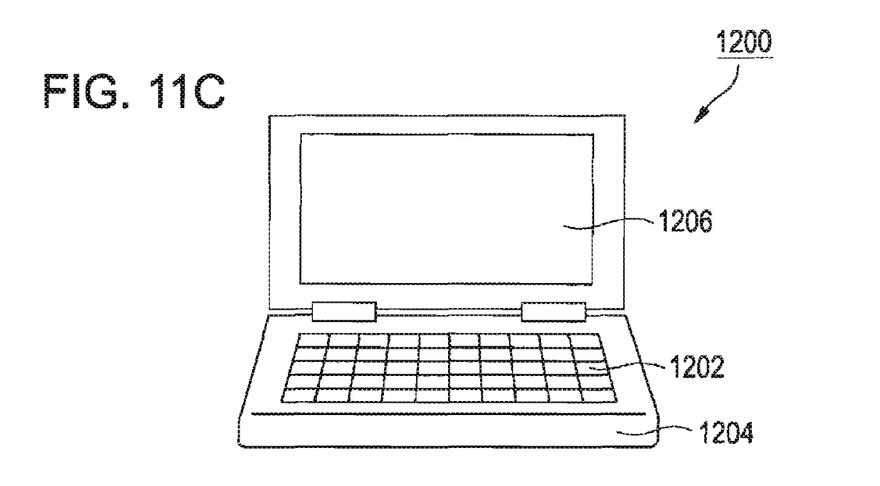

FIG. 11C is a perspective view showing an example of a portable information processing apparatus such as a word processor or a personal computer. In FIG. 11C, reference numeral 1200 represents an information processing apparatus, reference numeral 1202 represents an input unit such as a keyboard, reference numeral 1204 represents a main body of the information processing apparatus, and reference numeral 1206 represents a display unit using the organic EL device S.

The electronic apparatuses shown in FIGS. 11A to 11C include the organic EL device S. Therefore, it is possible to provide an electronic apparatus having desirable performance.

The invention is not limited to the above-described embodiments, but various changes and modifications of the invention can be made without departing from the scope of the invention as defined by the following claims.

For example, the above-described organic EL device S can be applied to a monochrome display.

Further, the light emitting layer 6 (the organic layer 4) of the organic EL device S according to the above-mentioned embodiments may be formed of, for example, a white light emitting material, and light components (white light) emitted from pixel regions may be converted into red light, green light, and blue light by using color filters, thereby forming a full-color image.

In the above-described embodiments, a so-called bottom emission device has been exemplified in which light from the light-emitting element 2 is emitted from the outer surface of the substrate 1. However, the invention may be applied to a so-called top emission device in which light from the light-emitting element 2 is emitted from the cathode 7 which is opposite to the outer surface of the substrate 1. In this case, the cathode 7 is formed of a transparent or translucent material capable of transmitting light.

What is claimed is:

1. An organic electroluminescent device comprising:
   a partition wall that surrounds a pixel region, on a substrate;
   a wiring line that is provided between the substrate and the partition wall; and
   an organic layer that is provided in the pixel region and on an upper surface of the partition wall;
   wherein, when a height of the partition wall is $H_B$, a film thickness of the organic layer in the pixel region is $H_E$, and a height of the wiring line is $H_L$, a sum of the height $H_B$ of the partition wall and the height $H_L$ of the wiring line is equal to or less than two times the film thickness $H_E$ of the organic layer, and the sum of the height $H_B$ of the partition wall and the height $H_L$ of the wiring line is equal to or less than 0.01 times a diameter $L_1$ of the pixel region, and
   wherein, when a distance between an edge of the partition wall and an edge of the wiring line is $L_2$, in plan view, a value that is 0.7 times the diameter $L_1$ is equal to or less than the distance $L_2$.

2. The organic electroluminescent device according to claim 1, wherein in the pixel region, a light-emitting element is arranged, which is provided with a first electrode, a second electrode, and the organic layer arranged between the first and second electrodes, and the wiring line is electrically connected to the first electrode.

3. The organic electroluminescent device according to claim 2, further comprising:

a transistor, which corresponds to the light-emitting element, on the substrate, wherein the wiring line is a wiring line that electrically connects the transistor and the first electrode.

4. An electronic apparatus comprising:

the organic electroluminescent device according to claim 1.

5. A method of manufacturing an organic electroluminescent device, comprising:

a wiring formation step that forms a wiring line on a substrate;

a partition wall formation step that forms, on the wiring line, a partition wall so as to surround a pixel region, the wiring line being provided between the substrate and the partition wall; and a liquid material supply step that forms an organice layer formed of a liquid material in the pixel region and on an upper surface of the partition wall, wherein when a height of the partition wall is $H_B$, a film thickness of the organic layer in the pixel region is $H_E$, and a height of the wiring line is $H_L$, a sum of the height $H_B$ of the partition wall and the height $H_L$ of the wiring line is equal to or less than two times the film thickness $H_E$ of the organic layer, and the sum of the height $H_B$ of the partition wall and the height $H_L$ of the wiring line is equal to or less than 0.01 times a diameter $L_1$ of the pixel region, and wherein, when a distance between an edge of the partition wall and an edge of the wiring line is $L_2$ in plan view, a value that is 0.7 times the diameter $L_1$ is equal to or less than the distance $L_2$.

6. The method of manufacturing an organic electroluminescent device according to claim 5, wherein the liquid material supply step coats the liquid material in the pixel region and on the upper surface of the partition walls, using a spin coating method.

* * * * *